United States Patent
Harker et al.

(10) Patent No.: US 8,890,564 B2
(45) Date of Patent: Nov. 18, 2014

(54) SYSTEM AND METHOD FOR DECREASING SIGNAL INTEGRITY NOISE BY USING VARYING DRIVE STRENGTHS BASED ON LIKELIHOOD OF SIGNALS BECOMING VICTIMS

(75) Inventors: Jay D. Harker, Denver, CO (US); Marek J. Marasch, Longmont, CO (US); Jeff S. Brown, Fort Collins, CO (US); Mark F. Turner, Longmont, CO (US); Carol A. Anderson, Mendota Heights, MN (US); Jay T. Daugherty, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 159 days.

(21) Appl. No.: 13/559,421

(22) Filed: Jul. 26, 2012

(65) Prior Publication Data

US 2013/0249591 A1 Sep. 26, 2013

Related U.S. Application Data

(60) Provisional application No. 61/614,007, filed on Mar. 22, 2012.

(51) Int. Cl.
*H03K 19/003* (2006.01)
*G06F 17/50* (2006.01)

(52) U.S. Cl.
USPC ............ 326/21; 326/30; 716/113; 716/115

(58) Field of Classification Search
USPC ...................... 716/5, 6, 15, 100, 106, 113
See application file for complete search history.

(56) References Cited

U.S. PATENT DOCUMENTS

| | | | |
|---|---|---|---|
| 6,499,131 B1 | 12/2002 | Savithri et al. | |
| 6,675,118 B2 * | 1/2004 | Wanek et al. | 702/117 |
| 7,058,907 B2 * | 6/2006 | Tuncer et al. | 716/113 |
| 7,111,259 B2 | 9/2006 | Casavant | |
| 7,454,731 B2 * | 11/2008 | Oh et al. | 716/113 |
| 7,469,391 B2 * | 12/2008 | Carrere et al. | 716/115 |
| 7,562,323 B1 * | 7/2009 | Bai et al. | 716/115 |
| 7,680,226 B2 * | 3/2010 | Murugan et al. | 375/346 |
| 7,694,202 B2 * | 4/2010 | Swanson et al. | 714/738 |
| 7,705,690 B2 * | 4/2010 | Lee et al. | 333/1 |
| 8,086,435 B1 * | 12/2011 | Alexander | 703/14 |
| 8,633,762 B2 * | 1/2014 | Kim et al. | 327/565 |
| 2009/0240448 A1 * | 9/2009 | Liaw et al. | 702/57 |

OTHER PUBLICATIONS

Jay D. Harker; Marek J. Marasch, Jeff S. Brown and Mark F. Turner, and David Smith; Provisional Application "System for Decreasing Signal Integrity Noise by Using Varying Drive Strengths Based on Likelihood of Signals Becoming Victims"; U.S. Appl. No. 61/614,007, filed Mar. 22, 2012; 3 pages.

\* cited by examiner

*Primary Examiner* — Vibol Tan
(74) *Attorney, Agent, or Firm* — Duft Bornsen & Fettig LLP

(57) ABSTRACT

A method of designing an integrated circuit, integrated circuits using different drive strengths and a signal integrity monitor are provide herein. In one embodiment, the signal integrity monitor includes: (1) a signal interface configured to receive a signal from a parallel data bus for transmission over a plurality of signal paths and (2) a victim signal identifier configured to dynamically determine a potential victim signal path of the plurality of signal paths.

22 Claims, 5 Drawing Sheets

SYSTEM AND METHOD FOR DECREASING SIGNAL INTEGRITY NOISE BY USING VARYING DRIVE STRENGTHS BASED ON LIKELIHOOD OF SIGNALS BECOMING VICTIMS

CROSS-REFERENCE TO RELATED APPLICATION

This application claims the benefit of U.S. Provisional Application Ser. No. 61/614,007, filed by Harker, et al., on Mar. 22, 2012, entitled "SYSTEM FOR DECREASING SIGNAL INTEGRITY NOISE BY USING VARYING DRIVE STRENGTHS BASED ON LIKELIHOOD OF SIGNALS BECOMING VICTIMS" commonly assigned with this application and incorporated herein by reference.

TECHNICAL FIELD

This application relates to, in general, integrated circuit design and, more specifically, to reducing signal integrity effects on conductors of integrated circuits.

BACKGROUND

The size of electronic circuits continues to decrease as process geometries continue to scale down. Additionally, the complexities of electronic circuit designs are increasing with the use of, for example, system on chip (SOC) designs, application specific integrated circuit (ASIC) designs or other types of silicon chips or dies. As such, electronic circuits are also becoming more compact. A single printed circuit board (PCB) can include multiple types of silicon chips that are connected to and communicate with each other or other components of the PCB. Often, the connections are via parallel interfaces having multiple signal paths. With the reduced size, compact designs, and increased interface speeds, maintaining signal integrity for signals traversing the signal paths of a parallel interface is a challenge.

SUMMARY

In one aspect, the disclosure provides a method of designing an integrated circuit. In one embodiment, the method includes: (1) identifying a signal path that is a potential victim signal path, wherein the signal path is positioned between a bus driver of a first component of the integrated circuit to an interface terminal of a second component of the integrated circuit and (2) increasing via a processor an effective drive strength of an interface driver of the potential victim signal path.

In another aspect, the disclosure provides a signal integrity monitor. In one embodiment, the signal integrity monitor includes: (1) a signal interface configured to receive a signal from a parallel data bus for transmission over a plurality of signal paths and (2) a victim signal identifier configured to dynamically determine a potential victim signal path of the plurality of signal paths.

In yet another aspect, the disclosure provides an integrated circuit. In one embodiment, the integrated circuit includes: (1) a parallel bus configured to transmit a signal, (2) a plurality of signal paths coupled to the parallel bus, (3) a plurality of interface drivers uniquely coupled to the parallel bus and the plurality of signal paths, wherein the plurality of interface drivers are configured to drive the signal along the plurality of signal paths and (4) a signal integrity monitor coupled to the parallel bus and the plurality of interface drivers. The signal integrity monitor having: (4A) a signal interface configured to receive the signal from the parallel bus and (4B) a victim signal identifier configured to dynamically determine a potential victim signal path of the plurality of signal paths based on the signal.

In still yet another aspect, the disclosure provides another embodiment of an integrated circuit that includes: (1) a parallel interface and (2) a plurality of interface drivers configured to drive a signal along signal paths of the parallel interface, wherein at least one of the interface drivers has a different drive strength than the other remaining interface drivers.

BRIEF DESCRIPTION

Reference is now made to the following descriptions taken in conjunction with the accompanying drawings, in which.

DETAILED DESCRIPTION

The capabilities of a parallel interface are limited by signal integrity effects. One cause of signal integrity effects are due to coupling of signals, such as a signal on one conductor coupling onto a signal of another conductor or multiple conductors. Signal coupling can occur, for example, when a signal (designated an aggressor signal) on a conductor or signal path changes state, such as from a low state to a high state, and the aggressor signal causes noise to be coupled or induced on a nearby conductor or conductors. The respective signal(s) (designated a victim signal or signals) on the nearby conductor or conductors is thereby compromised and the signal integrity of the victim signal or signals is impacted.

As such, the disclosure provides a scheme wherein the drive strength of an input and output (IO) buffer(s) is adjusted to reduce the interference of aggressor signals on potential victim signals. Thus, for an integrated circuit, such as a SoC design, the IO buffers, referred to herein as interface drivers, are configured such that signals most likely to be victims would have increased drive strengths than the drive strength of the aggressor signals. The disclosure provides embodiments of a system, method and apparatus to reduce the effect of noise coupled onto a potential victim signal on a bus by making static or dynamic adjustments to the drive strengths of the interface drivers.

Figure 1:
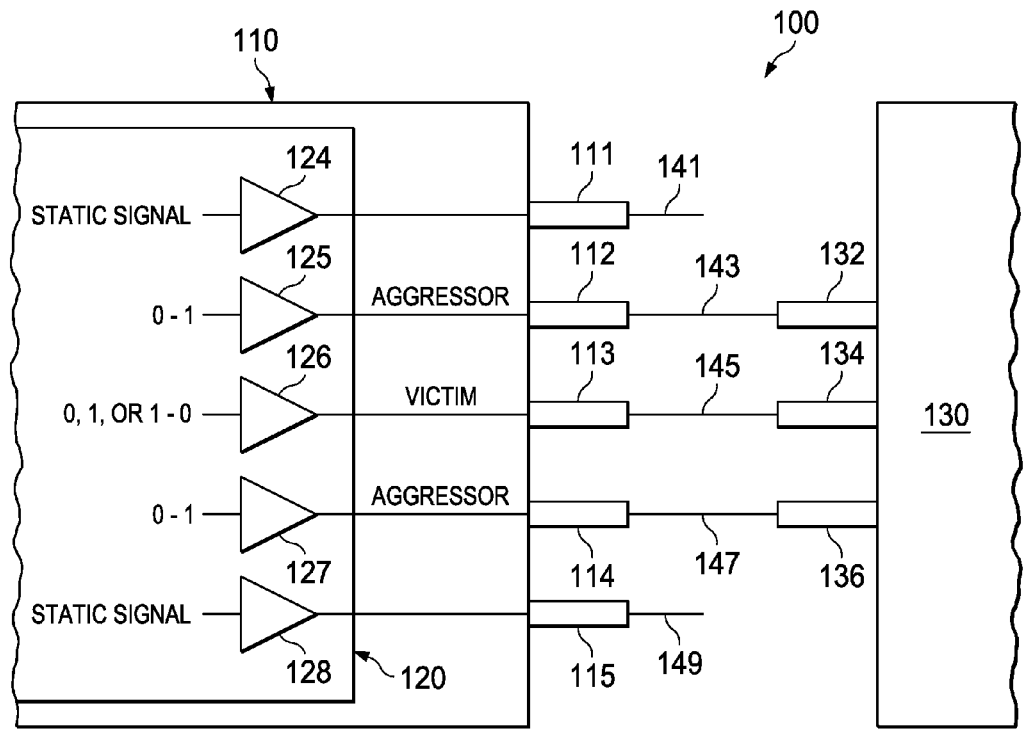
FIG. 1 illustrates a diagram of a printed circuit board illustrating potential victim signal scenarios according to the principles of the disclosure.

FIG. 1 illustrates a diagram of a portion of a PCB 100 that provides an example of identifying aggressor and potential victim signals according to the principles of the disclosure. The PCB 100 includes a package 110 and a destination component 130 that is external to the package 110. A package, for example, is a metal, plastic, glass, or ceramic casing containing one or more semiconductor electronic components. A package is also referred to as a semiconductor package. Different types of packages include a ball grid array and a lead frame. The package 110 includes interface terminals 111, 112, 113, 114 and 115 that form a parallel interface for the package 110. The destination component 130 also includes interface terminals, denoted 132, 134 and 136 that form a parallel interface for the destination component 130. In other embodiments, the package 110 and the destination component 130 can include additional interface terminals and parallel interfaces than those illustrated in FIG. 1. The interface terminals of the package 110 and the destination component 130 are conventional terminations employed in integrated circuits, such as pins or balls, for terminating connections to and from the package 110 and the destination component 130.

The package 110 also includes a silicon chip or die 120, such as a SoC or an ASIC, referred to hereinafter as chip 120. The chip 120 includes interface drivers 124, 125, 126, 127 and 128 that are configured to drive signals from the chip 120 out through the package 110, onto the PCB 100. The interface drivers 124, 125, 126, 127 and 128, drive the signals through the package 110 on corresponding signal paths 141, 143, 145, 147 and 149. Signal paths 143, 145 and 147 form a connection between the interface drivers 125, 126 and 127, and the interface terminals 132, 134 and 136, respectively, of the destination component 130. Signal paths 141 and 149 provide connections to other components or destinations that are not included in FIG. 1. For example, the static signals on signal paths 141 and 149 can be directed to power or ground. In other implementations, signal paths 141 and 149 can also be connected to the destination component 130. Signal paths 141-149 provide a parallel interface for the chip 120. In FIG. 1, a parallel interface of five paths is illustrated. One skilled in the art will understand the principles of the disclosure apply to a parallel interface having more (such as 14 signal paths) or even less than the five signal paths of FIG. 1. In addition to the number of signal paths, the ordering of the signals on the signal paths is also provided as an example. A different ordering of the signals can provide different potential victim signals.

A signal path is a conductor, conductive path or conductive net of the PCB 100. A signal path, for example, is a conductive trace. In FIG. 1, the chip 120 is a SoC and the destination component 130 is a memory.

FIG. 1 illustrates transitions on values of the signals that are received by the interface drivers 124-128 for transmission on the signal paths 141-149. The interface drivers 124-128 receive their respective signals from a parallel bus of the chip 120, such as a data bus or an address bus. In some embodiments, the signal received by each of the interface drivers 124-128 is a bit from a signal traversing the parallel bus of the chip 120. In other embodiments, multiple sources from the chip 120 provide signals to the interface drivers 124-128 for transmission.

In FIG. 1, "0-1" is a transition from a low logical state to a high logical state, "0" and "1" are static values of a low logical state and a high logical state, and "1-0" is a transition from a high logical state to a low logical state. As such, the signal on signal path 145 is designated as being a potential victim, and the signals that are switching the same as each other, i.e., differently than the potential victim signal, are called aggressors. Thus, in the illustrated example of FIG. 1, the signal on signal path 145 can be identified to be at risk of being a victim based on having two immediate neighbors switching independently. Yet the signals of signal paths 143 and 147 are not identified as high risk due to the absence of surrounding signals that are transitioning differently. As such, the illustrated embodiment of FIG. 1 provides but one example of one configuration wherein a potential victim signal is identified according to the principles of the disclosure. In another embodiment having a single potential victim on signal path 145, the signals on signal paths 141 and 149 are switching signals as the indicated aggressor signals on signal paths 143 and 147.

Figure 2:
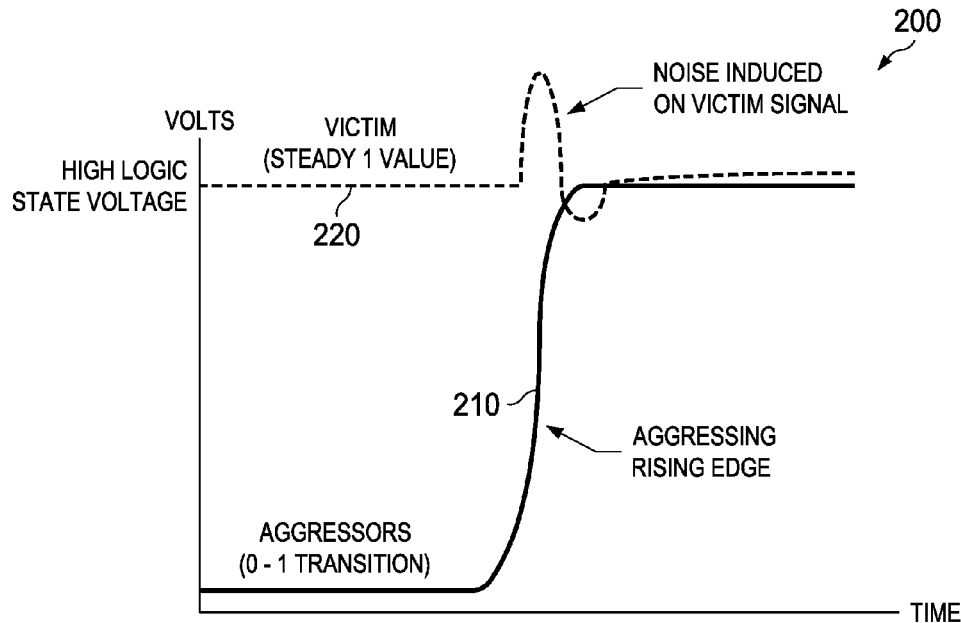
FIG. 2 illustrates a graph representing the effect of an aggressor signal on a victim signal.

FIG. 2 illustrates a graph 200 representing the effect of an aggressor signal on a victim signal. The graph 200 has a vertical axis of volts and a horizontal axis of time. An aggressor signal 210 is represented by a solid line and a victim signal 220 is represented by a dashed line. The aggressor signal 210, for example, could be the signal on signal path 143 or signal path 147 of FIG. 1. The victim signal 220, for example, could be the signal on signal path 145 of FIG. 1. The aggressor signal 210 transitions from a low logic state to a high logic state over time, e.g., an operating cycle of the chip 120. The victim signal 220 is a steady, high state signal. As the aggressor signal 210 transitions from the low logic state to the high logic state, noise is induced on the victim signal 220 as noted in FIG. 2.

The disclosure is directed to maintaining the integrity of the victim signal 220. In one embodiment, the disclosure provides a method implemented during the design phase of an integrated circuit. During the design phase the package layout is examined to determine signal paths that are at risk or at most risk for showing victim-like behavior. These signals paths are then assigned different drive strengths than nearby aggressor signal paths to improve signal quality on the potential victim signal path(s). Some or all of the drive strengths can be adjusted to improve signal quality on the potential victim signal path(s). For example, in different embodiments, a victim(s) drive strength is increased, an aggressor(s) drive strength is decreased or a combination of both is performed. Accordingly, FIG. 3 provides an embodiment of a method to prevent or at least reduce the effect of aggressor signals on potential victim signals.

Figure 3:
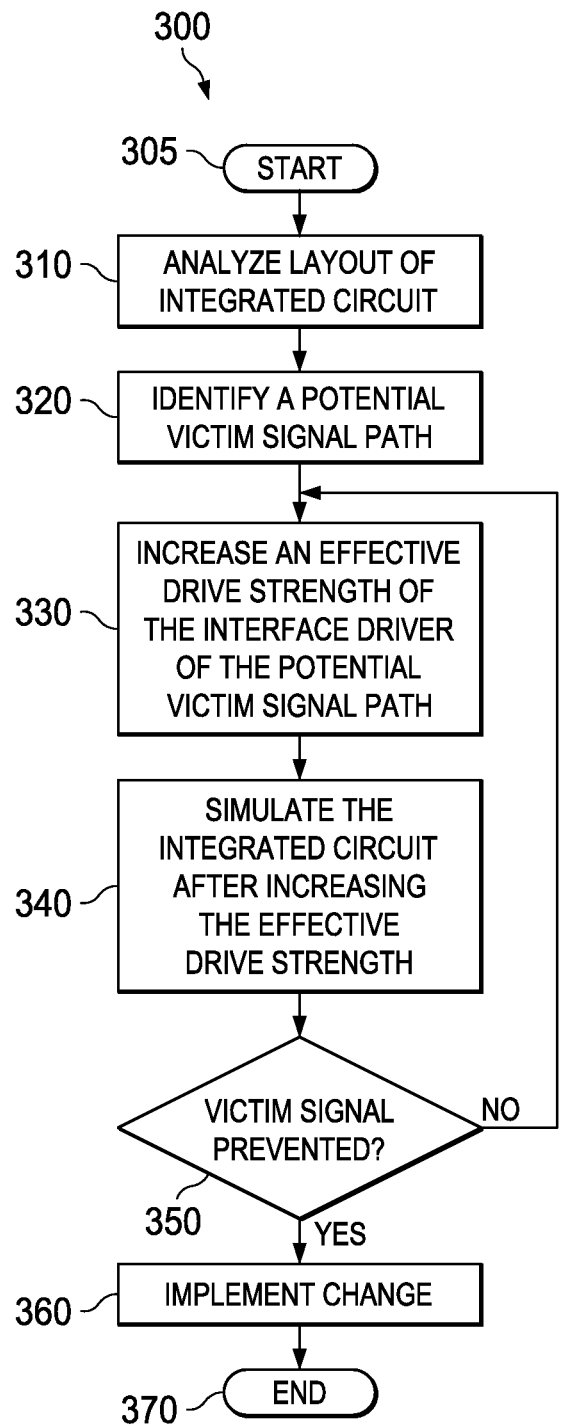
FIG. 3 illustrates a flow diagram of an embodiment of a method of designing an integrated circuit carried out according to the principles of the disclosure.

FIG. 3 illustrates a flow diagram of an embodiment of a method 300 of designing an integrated circuit carried out according to the principles of the disclosure. The method 300 provides a design solution wherein varying drive strengths can be hard-coded in the integrated circuit design. In one embodiment, the integrated circuit corresponds to at least part of the electronic circuitry of a PCB. At least a portion of the method 300 is performed by a processor. The method 300 begins in a step 305.

In a step 310, a layout of the integrated circuit and spatial relationships of the layout between signal paths and components thereof are analyzed. The physical geometry of the integrated circuit is analyzed including the various packages, chips, components, interface terminals, signal paths, etc. The spacing between and the order of or location of the various signal paths is also analyzed.

A signal path of the integrated circuit that is a potential victim signal path is identified in a step 320. In one embodiment, multiple potential victim signal paths can be identified. A signal path is positioned between an interface driver of a first component of the integrated circuit to an interface terminal of a second component of the integrated circuit. The signal path can be one of a plurality of signal paths coupled to interface terminals of the first component. As such, in one embodiment, the potential victim signal path or paths are part of a parallel interface. The first component, for example, can be a SoC of a package of the integrated circuit and the second component can be a memory of the integrated circuit.

In one embodiment, the potential victim signal path is identified based on the physical geometry of the integrated circuit. Thus, from the analysis of step 310, potential victim signal paths are identified. In one embodiment, a potential victim signal path is identified based on the surrounding interface terminals or signal paths associated therewith. In some embodiments, a potential victim signal path is identified based on cross-coupling between the signals on signal paths. For example, the signal path for the signal with the greatest cross-coupling of a set of signals is identified as a potential victim signal path.

As such, in some embodiments, identifying potential victim signal paths includes analyzing signals for transmission on the plurality of signal paths of the integrated circuit. Accordingly, consideration is given to static signals and transitioning signals and their spatial relationship to each other on the integrated circuit. The type of transitioning can also be considered to identify potential victim signal paths. For example, signals that have the same transition, high to low or low to high, on adjacent signal paths typically do not effect each other in a harmful manner. In contrast, adjacent signals having opposing transitions will have more severe signal integrity impacts.

In a step 330, an effective drive strength of an interface driver of the potential victim signal path is increased. In one embodiment, increasing the effective drive strength includes reducing a drive impedance of the interface driver of the potential victim signal path. In another embodiment, increasing the effective drive strength includes increasing a drive impedance of an interface driver of at least one signal path (i.e., a signal path of an aggressor signal) adjacent to the potential victim signal path. As such, changing the effective drive strength of an interface driver is relative to the drive strengths of other interface drivers, such that a victim can be strengthened, aggressors can be weakened or both. Effective drive strength is denoted according to the output impedance of an interface driver.

The method 300 continues to step 340 by simulating the integrated circuit after increasing the effective drive strength. A simulation tool or simulator is used to simulate the change to effective drive strength. In one embodiment, the simulation tool SPICE, which is available from the University of California at Berkeley, is employed to simulate the integrated circuit.

In a decisional step 350, a determination is made if the adjustment to the effective drive strength prevents a victim signal. The determination is based on the simulation of the integrated circuit after implementing the drive strength changes. In some embodiments, the simulation results are compared to industry standards to determine if an adjustment is successful to meet required parameters. Standards from the Joint Electron Devices Engineering Council (i.e., JEDEC standards) are an example of industry standards for double data rate (DDR) memory interfaces that can be employed for the results of the drive strength changes. If the adjustment or adjustments does not prevent a victim signal, the method 300 returns to step 330 for more drive strength adjustments. If the adjustment or adjustments does prevent a victim signal, the method 300 continues to step 360 where the adjustment to the effective drive strength is implemented based on the simulation. The method 300 then continues to step 370 and ends. As such, integrated circuit design can then continue as a conventional design process and proceed to tape out.

In some embodiments, the various combinations of drive strength changes can be unsuccessful to prevent potential victim signal paths. Accordingly, a redesign of the integrated circuit is performed. Thus, a slow down of the interface speed or changes to the buffers, packages, PCB, etc., of the integrated circuit is implemented.

Figure 4:
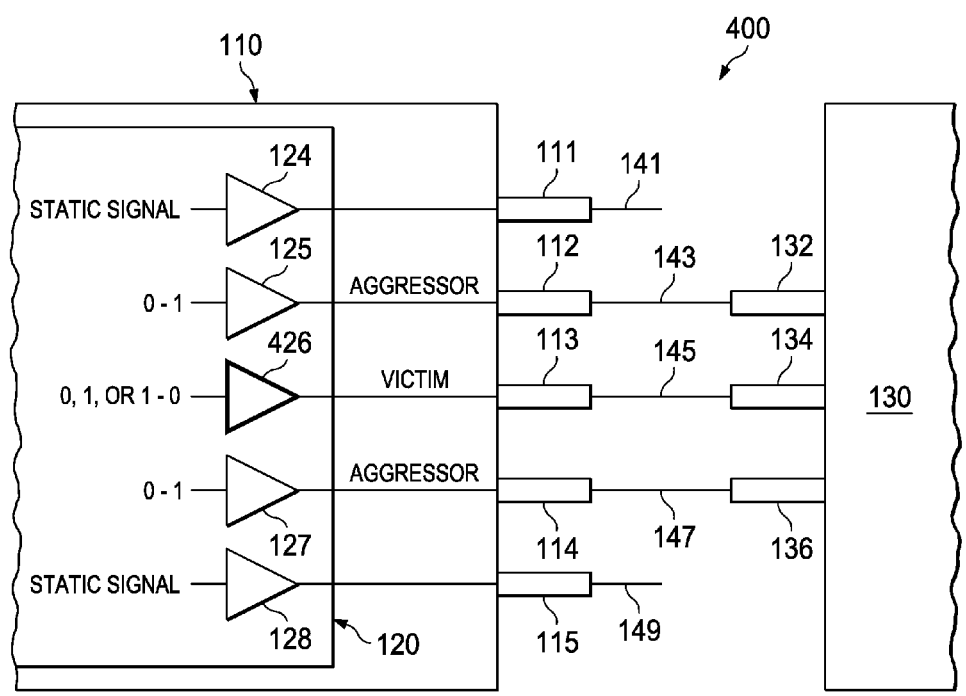
FIG. 4 illustrates a diagram of an embodiment of an integrated circuit constructed according to the principles of the disclosure.

FIG. 4 illustrates a schematic of an embodiment of an integrated circuit 400 constructed according to the principles of the disclosure. The integrated circuit 400 is similar to the integrated circuit 100 of FIG. 1. Corresponding elements therefore are denoted with the same element number. Unlike the integrated circuit 100, integrated circuit 400 includes interface buffer 426 which has an effective drive strength that differs from the effective drive strengths of the other interface drivers 124, 125, 127 and 128. In the illustrated embodiment of FIG. 4, the effective drive strength of the interface buffer 426 is increased relative to the effective drive strengths of the other interface drivers 124, 125, 127 and 128 to address the potential victim signal of signal path 145. Thus, unlike conventional integrated circuit designs, each of the interface buffers associated with a parallel interface do not have the same drive strength. In some embodiments, more than two drive strengths can be used for the different interface drivers. In one embodiment, the integrated circuit 400 is designed according to the method 300.

Figure 5:
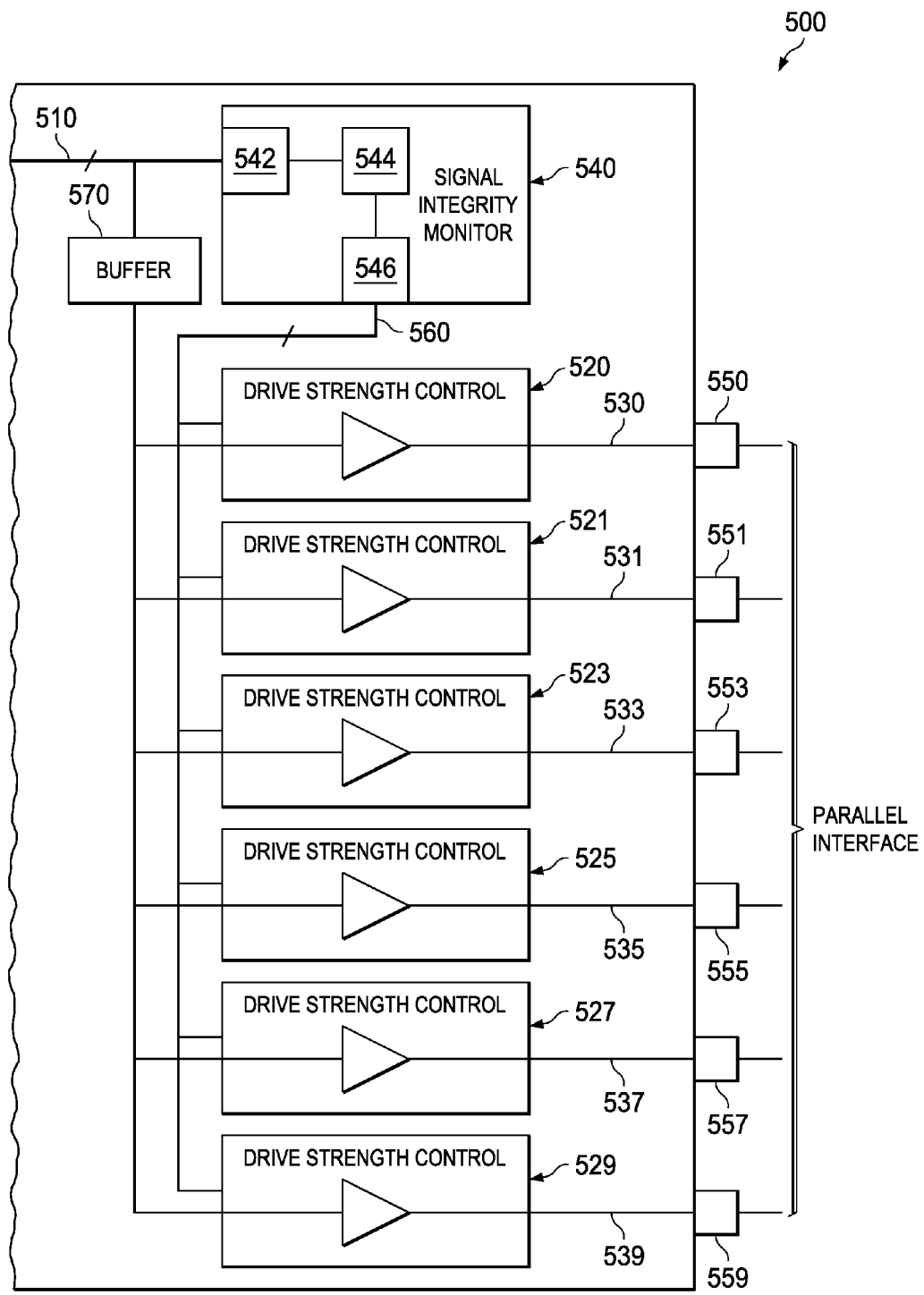
FIG. 5 illustrates a diagram of another embodiment of an integrated circuit constructed according to the principles of the disclosure.

FIG. 5 illustrates a schematic of another embodiment of an integrated circuit 500 constructed according to the principles of the disclosure. The integrated circuit 500 is a portion of an electronic circuit located on a PCB. In one embodiment, the integrated circuit 500 is a silicon chip or die, such as a SoC or an ASIC, that is part of a package located on the PCB. The integrated circuit 500 includes a parallel bus 510, a plurality of interface drivers 520, 521, 523, 525, 527, 529, and a corresponding plurality of signal paths 530, 531, 533, 535, 537 and 539. The integrated circuit 500 also includes a signal integrity monitor 540, a control bus 560 that couples the signal integrity monitor to the interface drivers 520-529 and a buffer or buffers, buffer 570. The integrated circuit 500 includes external terminations 550, 551, 553, 555, 557 and 559 coupled to the signal paths 530-539. The interface drivers 520-529 are configured to drive signals across the signal paths 530-539 through the corresponding external terminations 550-559 to a load, such as a memory located on the PCB. As such, the signal paths 530-539 extend past the external terminations 550-559.

The parallel bus 510, interface drivers 520-529 and the signal paths 530-539 can be conventional components that are typically included in integrated circuits. For example, the parallel bus 510 can be a data bus, an address bus or another type of bus configured to transmit signals in parallel. The interface drivers 520-529 are conventional output drivers that provide power to transmit the signals from the parallel bus 510 along the signal paths 530-539. Each of the interface drivers 520-529 has an adjustable drive strength. The drive strength can be selected via an input received through control ports (not denoted in FIG. 5) of the interface drivers 520-529.

The signal integrity monitor 540 is configured to dynamically control the effective drive strength of the interface drivers 520-529 to minimize coupling noise on the signal paths 530-539. Thus, the signal integrity monitor 540 provides an on-chip logic solution to address signal integrity. The signal integrity monitor 540 can dynamically adjust the drive strengths of the interface drivers 520-529 of potential victim versus aggressor signals to mitigate coupled noise issues and preserve signal integrity. The signal integrity monitor 540 is a state machine configured to perform the functions described herein for dynamically adjusting the drive strengths. Accordingly, the signal integrity monitor 540 includes the necessary logic to perform the dynamic drive strength adjustments. In another embodiment, the signal integrity monitor 540 or at least a portion thereof is implemented via software.

The signal integrity monitor 540 includes a signal interface 542, a victim signal identifier 544 and a drive strength controller 546. The signal interface 542 is configured to receive the signal from the parallel data bus 510 that is to be transmitted over a plurality of signal paths 530-539 via the interface drivers 520-529. The signal interface 542 is a conventional interface configured to connect to the parallel bus 510 to receive the signal thereon.

The victim signal identifier 544 is configured to dynamically determine a potential victim signal path of the plurality of signal paths 530-539. In one embodiment, the victim signal identifier 544 is configured to dynamically determine the potential victim signal path based on an order of the external terminations 550-559. Each one of the external terminations 550-559 is uniquely associated with the plurality of signal paths 530-539 and the interface drivers 520-529. By examining the order of the outgoing signals via the interface drivers 520-529, the signal paths 530-539, the external terminations 550-559 or routing of the signal paths 530-539 after the external terminations 550-559 to the destination, the victim signal identifier 544 can determine adjacent signals paths for identifying potential victim signals.

In another embodiment, the victim signal identifier 544 is configured to dynamically determine the potential victim signal path based on a pattern of the signal traversing the parallel bus 510. In some embodiments, the victim signal identifier 544 is configured to consider both the order of the outgoing signals and the pattern of the signal when dynamically adjusting the drive strengths.

The drive strength controller 546 is configured to generate a driver control signal (also referred to as a drive control) to adjust an effective drive strength of at least one output driver corresponding to one of the plurality of signal paths and associated with the potential victim signal path. The drive strength controller 546 is configured to adjust the effective drive strength before the signal is delivered from the parallel bus 510 to the plurality of signal paths 530-539. The buffer 570 is employed to delay the signal on the parallel bus 510 until the driver control signal arrives to adjust at the interface drivers 520-529 and the effective drive strength or strengths are adjusted. The buffer 570 is appropriately sized to allow the effective drive strengths to be changed before the signal on the parallel bus 510 arrives at the interface drivers 520-529, or at least before the interface drivers 520-529 are ready to drive the respective signals. In one embodiment, the buffer 570 is a conventional register or first-in first-out buffer. The driver control signal corresponds to the type of interface drivers that are employed. In one embodiment, the interface drivers 520-529 are conventional controlled output impedance drivers having 50 ohm and 75 ohm output impedances that are selected by the driver control signal. In one embodiment, the driver control signal is a two bit signal that corresponds to the output impedance desired for the interface drivers 520-529. For example, the driver control signal "10" can correspond to a 50 ohm output impedance for the interface drivers 520-529 and a driver control signal of "11" can indicate an output impedance of 75 ohms. The driver control signal is delivered via conventional means to the various interface drivers 520-529.

Figure 6A:
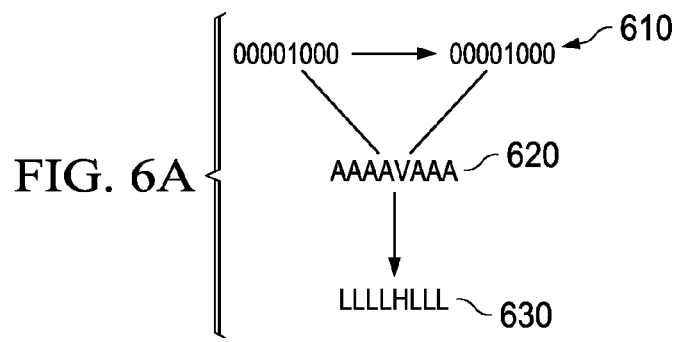
FIG. 6A, FIG. 6B and FIG. 6C illustrate examples of identifying potential victim signals based on transitions of a signal according to the principles of the disclosure.
Figure 6B:
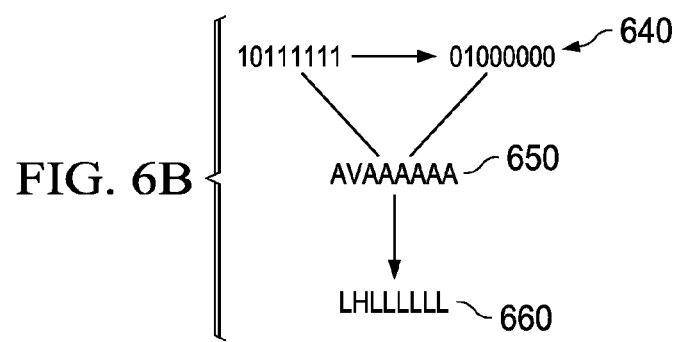
Figure 6C:
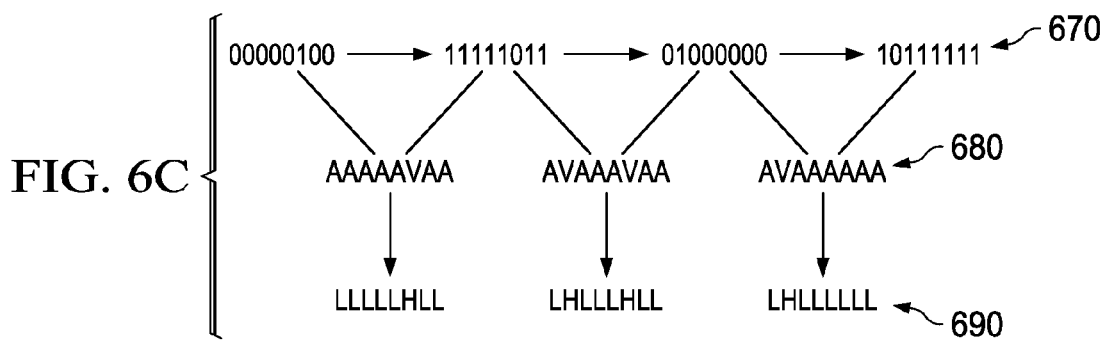

In one embodiment when considering the pattern of the signal, the signal integrity monitor 540 is configured to dynamically determine potential victim signal paths associated with each bit of the signal for each operating cycle associated with the signal. FIG. 6A, FIG. 6B and FIG. 6C provide examples of analyzing a signal pattern and determining transitions between operating cycles for an eight bit signal. The determination of aggressor signals versus victim signals on signal paths translates to higher and lower relative drive strengths. Aggressor signals and victim signal are represented by an "A" and a "V" in FIGS. 6A, 6B and 6C. In FIG. 6A and FIG. 6B, a single transition is analyzed. In FIG. 6C, multiple transitions are analyzed.

In FIGS. 6A, 6B and 6C, the relative drive strengths of interface drivers are represented by "H" and "L." The relative drive strengths "H" and the "L" do not necessarily represent just two drive strengths. As such, all "L" drive strength are not necessarily the same drive strength and all of the "H" drive strengths are not necessarily the same drive strength. Instead, the victim signal identifier 544 is configured to consider the order of the outgoing signals on the signal paths. For example, if the victim signal identifier 544 determines a potential victim signal is on an edge (i.e., has a single adjacent signal path) or an effective edge path, the signal integrity monitor 540 can provide a relatively small driver strength adjustment compared to if the potential victim signal is located in the middle of the signal paths. An effective edge path is not on the edge of a package but effectively behaves as it is due to having static signals or sufficient shielding to cause it to act as if physically located on the edge of the package. In some embodiments, victim signal identifier 544 is configured to adjust the drive strengths for aggressor signals differently based on the location from the potential victim signal. Thus, in some embodiments, the "H" and "L" in FIGS. 6A, 6B and 6C are not necessarily two distinct values but relative values. The relative H and L drive strengths are implemented before the new value or values are transmitted by the interface drivers 520-529.

In FIG. 6A, line 610 represents a transition of an eight bit signal over a single operating cycle. Each bit, represented by "0" or "1," corresponds to a path of the parallel bus 510 and one of the interface drivers 520-529 that transmits the bit along the corresponding ones of the signal paths 530-539. The second line 620 denotes the potential aggressor and victim signals that are identified by the victim signal identifier. In FIG. 6A, the fifth signal is identified as a potential victim signal since it transitions from a "1" to a "0" and the adjacent signals transition from a "0" to a "1." The third line 630 represents the relative drive strengths that the drive strength controller 546 determines for the corresponding buffers 520-529. The drive strength controller 546 is configured to transmit the drive control to the interface drivers 520-529 to adjust the effective drive strengths thereof if needed.

FIG. 6B provides an additional example of a single cycle transition of an eight bit signal. Line 640 represents the transition and line 650 indicates the potential victim signal that is identified by the victim signal identifier 544. In this example, the second signal, which transitions from "0" to "1," is identified as a potential victim signal. Line 660 represents the relative drive strengths that the drive strength controller 546 determines for the corresponding interface drivers 520-529.

FIG. 6C illustrates transitions of an eight bit signal over three operating cycles. Line 670 represents the eight bit signal as it transitions over each cycle. Line 680 represents the potential victim signals that are identified by the victim signal identifier 544 from each transition pattern. Line 690 represents the relative drive strengths that the drive strength controller 546 determines for the corresponding interface drivers 520-529. In line 680, different types of potential victims are identified. The first potential victim is transitioning opposite. In the next transition, this potential victim is holding the same value and still identified as a potential victim. Various other criteria can be used to identify potential victim signal or signal paths according to the principles of the disclosure in addition to the examples provided herein.

The above-described apparatuses and methods, or at least a portion thereof, may be embodied in or performed by various conventional digital data processors or computers, wherein the computers are programmed or store executable programs of sequences of software instructions to perform one or more of the steps of the methods, e.g., steps of the method of FIG. 3. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, e.g., one or more of the steps of the method of FIG. 3, or functions of the apparatuses such as the signal integrity monitor or at least a portion thereof described herein. Additionally, an apparatus, such as an electronic design automation (EDA) tool or other computer aided design (CAD) tool, may be designed to include the necessary circuitry to perform a step or steps of the method of FIG. 3.

Certain embodiments of the invention further relate to computer storage products with a non-transitory computer-readable medium that have program code thereon for performing various computer-implemented operations that embody the tools or carry out the steps of the methods set forth herein. Non-transitory used herein refers to all computer-readable media except for transitory, propagating signals.

The media and program code may be those specially designed and constructed for the purposes of the invention, or they may be of the kind well known and available to those having skill in the computer software arts. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which this application relates will appreciate that other and further additions, deletions, substitutions and modifications may be made to the described embodiments.

What is claimed is:

1. A method of designing an integrated circuit, comprising:
    identifying a signal path that is a potential victim signal path, wherein said signal path is positioned between a bus driver of a first component of said integrated circuit to an interface terminal of a second component of said integrated circuit; and
    increasing via a processor an effective drive strength of an interface driver of said potential victim signal path, wherein said increasing includes changing a drive strength of an interface driver of at least one signal path adjacent to said potential victim signal path.

2. The method as recited in claim 1 wherein said increasing includes reducing a drive impedance of said interface driver of said potential victim signal path.

3. The method as recited in claim 1 wherein said increasing includes increasing a drive impedance of said interface driver of said at least one signal path adjacent to said potential victim signal path.

4. The method as recited in claim 1 wherein said signal path is one of a plurality of signal paths coupled to interface terminals of said first component.

5. The method as recited in claim 4 wherein said method further includes analyzing a layout of said integrated circuit and spatial relationships of said layout between said plurality of signal paths, said first component and said second component.

6. The method as recited in claim 4 wherein said identifying includes analyzing signals for transmission on said plurality of signal paths.

7. The method as recited in claim 1 further comprising simulating said integrated circuit after increasing said effective drive strength and implementing said effective drive strength based on said simulating.

8. A signal integrity monitor, comprising:
    a signal interface configured to receive a signal from a parallel data bus for transmission over a plurality of signal paths;
    a victim signal identifier configured to dynamically determine a potential victim signal path of said plurality of signal paths; and
    a drive strength controller configured to generate a drive control to adjust an effective drive strength of at least one interface driver corresponding to at least one of said plurality of signal paths and associated with said potential victim signal path.

9. The signal integrity monitor as recited in claim 8 wherein said victim signal identifier is configured to dynamically determine said potential victim signal path based on an order of external interface terminals uniquely associated with said plurality of signal paths.

10. The signal integrity monitor as recited in claim 8 wherein said victim signal identifier is configured to dynamically determine said potential victim signal path based on a pattern of said signal.

11. The signal integrity monitor as recited in claim 8 wherein said victim signal identifier is further configured to dynamically determine said potential victim signal path based on relative transitions of bits, relative to one another, of said plurality of signal paths for each operating.

12. The signal integrity monitor as recited in claim 8 wherein said victim signal identifier is configured to dynamically determine potential victim signal paths associated with each bit of said signal for each operating cycle associated with said signal.

13. The signal integrity monitor as recited in claim 12 wherein said victim signal identifier is configured to dynamically determine said potential victim signal path based on a transition pattern of said signal at each said cycle.

14. The signal integrity monitor as recited in claim 8 wherein said drive strength controller is configured to adjust said effective drive strength before said signal is delivered to said plurality of signal paths.

15. An integrated circuit, comprising:
    a parallel bus configured to transmit a signal;
    a plurality of signal paths coupled to said parallel bus;
    a plurality of interface drivers uniquely coupled to said parallel bus and said plurality of signal paths, wherein said plurality of interface drivers are configured to drive said signal along said plurality of signal paths; and
    a signal integrity monitor coupled to said parallel bus and said plurality of interface drivers, said signal integrity monitor including:
        a signal interface configured to receive said signal from said parallel bus; and
        a victim signal identifier configured to dynamically determine a potential victim signal path of said plurality of signal paths based on said signal.

16. The integrated circuit as recited in claim 15 further comprising a drive strength controller configured to generate a drive control to adjust an effective drive strength of at least one interface driver corresponding to one of said plurality of signal paths and associated with said potential victim signal path before said signal is delivered to said plurality of signal paths.

17. The integrated circuit as recited in claim 15 wherein said victim signal identifier is configured to dynamically determine said potential victim signal path based on a pattern of said signal.

18. The integrated circuit as recited in claim 15 wherein said victim signal identifier is further configured to dynamically determine said potential victim signal path based on an order of external interface terminals uniquely associated with said plurality of signal paths.

19. The integrated circuit as recited in claim 15 wherein said victim signal identifier is configured to dynamically determine potential victim signal paths associated with each bit of said signal for each operating cycle associated with said signal.

20. The integrated circuit as recited in claim 19 wherein said victim signal identifier is configured to dynamically determine said potential victim signal path based on a transition pattern of said signal at each said cycle.

21. An integrated circuit, comprising:
a parallel interface;
a plurality of interface drivers configured to drive a signal along a plurality of signal path associated with said parallel interface;
a victim signal identifier configured to dynamically determine a potential victim signal path of said plurality of signal paths; and
a drive strength controller configured to generate a drive control to adjust an effective drive strength of at least one of said plurality of interface drivers corres ponding to at least one of said plurality of signal paths and associated with said potential victim signal path.

22. The integrated circuit as recited in claim 21 wherein said integrated circuit is a chip of a package on a printed circuit board.

\* \* \* \* \*